United States Patent [19]
Hemmie

[11] Patent Number: 5,020,149
[45] Date of Patent: * May 28, 1991

[54] INTEGRATED DOWN CONVERTER AND INTERDIGITAL FILTER APPARATUS AND METHOD FOR CONSTRUCTION THEREOF

[75] Inventor: Dale L. Hemmie, Burlington, Iowa

[73] Assignee: Conifer Corporation, Burlington, Iowa

[ * ] Notice: The portion of the term of this patent subsequent to Dec. 20, 2005 has been disclaimed.

[21] Appl. No.: 261,557

[22] Filed: Oct. 24, 1988

Related U.S. Application Data

[63] Continuation-in-part of Ser. No. 102,726, Sep. 30, 1987, Pat. No. 4,791,717.

[51] Int. Cl.[5] .......................... H04B 1/18; H04B 1/08; H01P 1/205; H05K 7/14

[52] U.S. Cl. .................................... 455/325; 455/347; 174/52.1; 174/52.3; 361/394; 361/395; 361/399; 333/203

[58] Field of Search .............. 333/203; 174/52.1, 52.3; 361/394, 395, 399, 424; 455/318, 319, 325, 323, 347

[56] References Cited

U.S. PATENT DOCUMENTS

| | | | |
|---|---|---|---|
| 3,593,223 | 7/1971 | King et al. | 333/203 |
| 4,019,141 | 4/1977 | Numan et al. | 174/52.1 X |
| 4,112,398 | 9/1978 | Burnett et al. | 333/203 |
| 4,152,671 | 5/1979 | Tuma et al. | 174/52.1 X |
| 4,384,367 | 5/1983 | King et al. | 455/325 |
| 4,569,000 | 2/1986 | Noji | 361/399 X |
| 4,772,862 | 9/1988 | Kubo et al. | 333/185 X |
| 4,791,717 | 12/1988 | Hemmie | 29/600 |
| 4,831,498 | 5/1989 | Baba | 361/399 X |

*Primary Examiner*—Eugene R. LaRoche
*Assistant Examiner*—Benny T. Lee
*Attorney, Agent, or Firm*—Dorr, Carson, Sloan & Peterson

[57] ABSTRACT

An integrated down converter and interdigital filter apparatus having a down converter and a number of interdigital filters mounted on the same printed circuit board and installed in the watertight housing. The housing of each interdigital filter is cut from sheet metal, with a conductive surface on the printed circuit board as one side. A method for construction of the interdigital filter is also set forth.

8 Claims, 15 Drawing Sheets

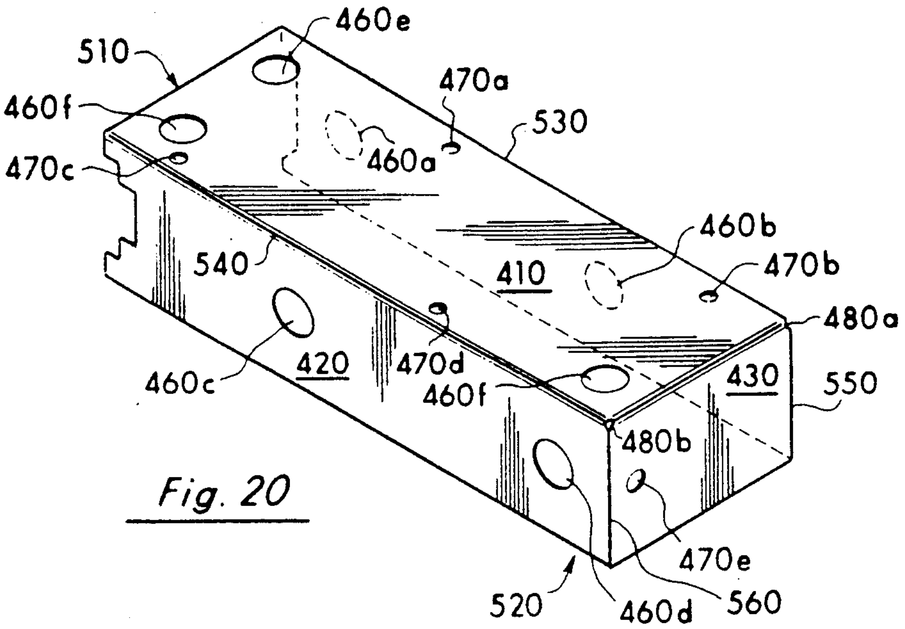
Fig. 20
Fig. 21
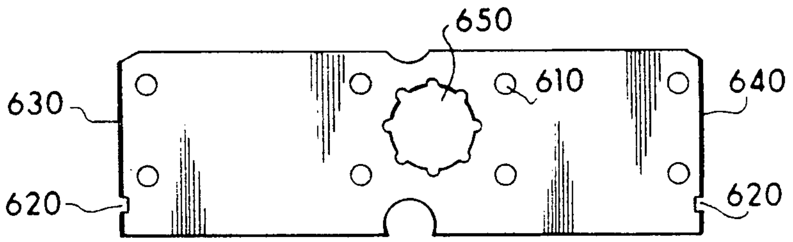
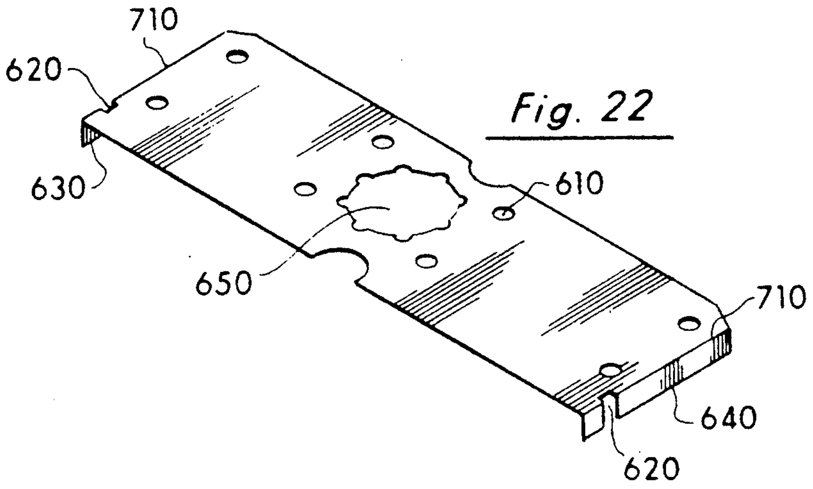
Fig. 22

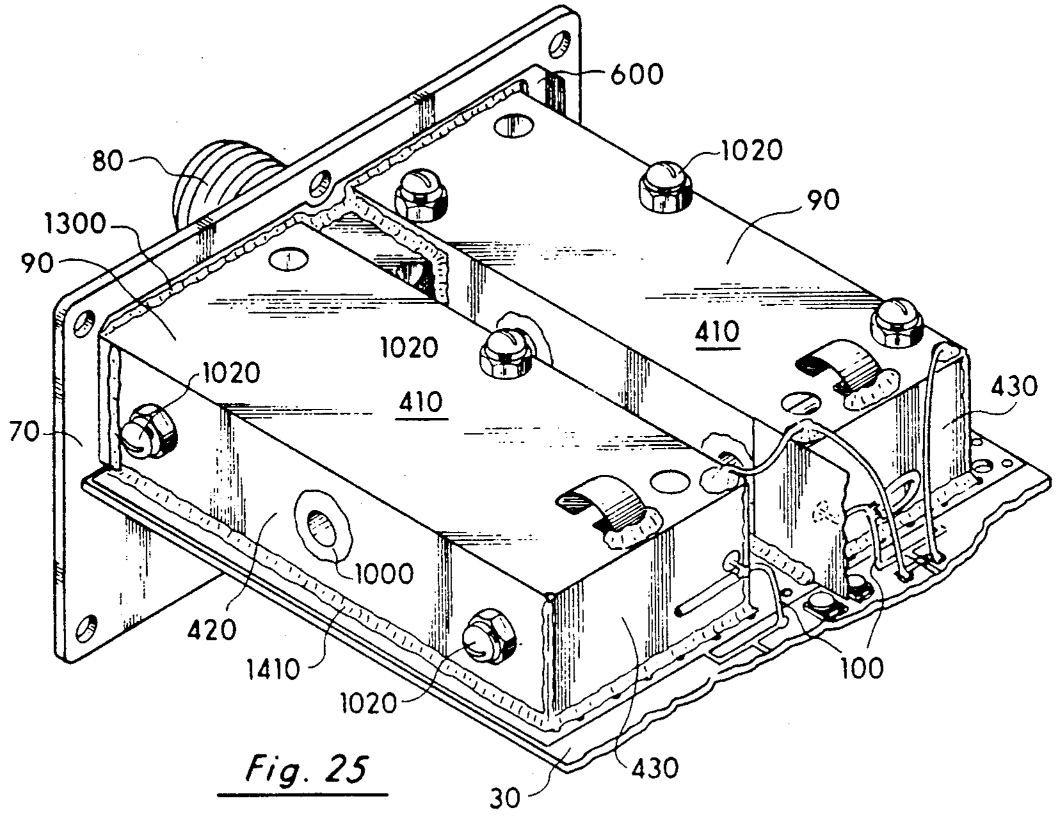
Fig. 25
Fig. 24
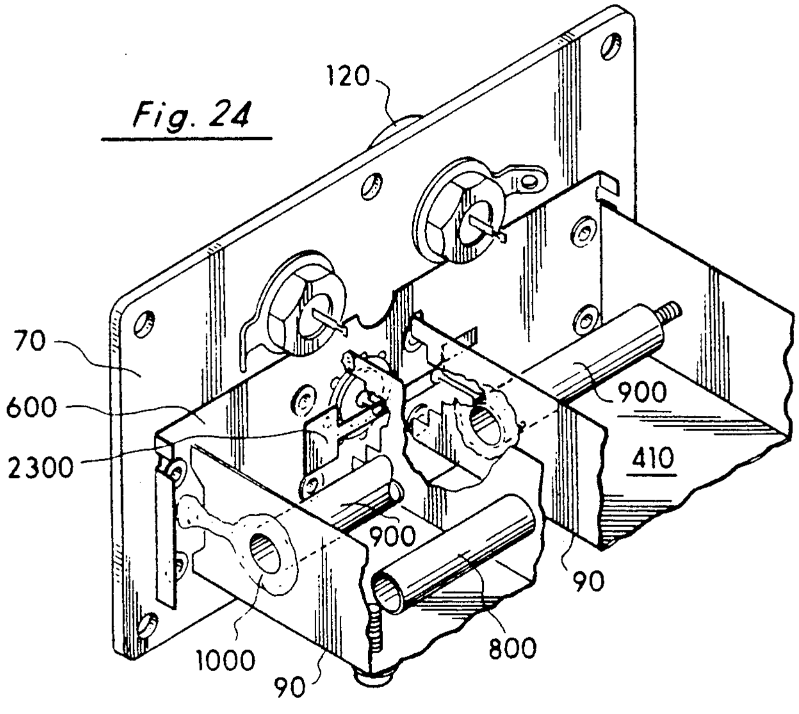

INTEGRATED DOWN CONVERTER AND INTERDIGITAL FILTER APPARATUS AND METHOD FOR CONSTRUCTION THEREOF

RELATED APPLICATIONS

This application is a continuation-in-part of U.S. patent application Ser. No. 102,726 filed on Sept. 30, 1987, issued as U.S. Pat. No. 4,791,717.

BACKGROUND OF THE ART

1. Field of the Invention

The present invention relates to microwave down converters and interdigital filters and, more particularly, to the combining of one or more interdigital filters into the down converter and the method for constructing the integrated combination.

2. Discussion of Prior Art

Various types of down converters are readily available for converting microwave signals such as in the range of frequencies from 2150 to 2162 MHz (MDS) and 2500 to 2686 MHz (ITFS) received by an appropriate antenna such as an MDS antenna to a corresponding electrical signal for delivery to a receiver. A conventional down converter for an MDS antenna is of the type manufactured by Conifer Corporation, P.0. Box 1025, Burlington, Iowa 52601, available as the QL Series.

Conventional down converters generally use two types of integrated filters. The first type of integrated band pass filter is a printed filter and the second type is a dual cavity filter. While such filters function adequately for single channel MDS applications, they do not function adequately in multiple channel situations.

Interdigital filters exhibiting greater IF rejection, better out-of-band rejection and lower in-band insertion loss than printed and dual cavity filters are commercially available for use with down converters. The theoretical basis for the design of interdigital filters is well known as set forth in the article by Jerry Hinshaw and Shahrokh Monemzadeh, "Computer-Aided Interdigital Bandpass Filter Design." Ham Radio Magazine, January 1985, Pages 12–26. Such interdigital filters, however, are available only as separate circuits and, therefore, require a separate housing and a separate jumper cable to interconnect the interdigital filter with the down converter. Both the interdigital and the down converter are placed near the antenna in the outside environment thereby necessitating a waterproof housing for each. The provision of a separate waterproof housing for the interdigital filter is expensive. Likewise, the provision of a jumper cable not only adds to the cost, but also degrades the signal as well as provide an impedance mismatching problem.

Furthermore, a conventional interdigital filter such as those available from Microwave Filter Company, Inc., 6743 Kinne St., East Syracuse, N.Y. 13057 as Model No. 3746 are expensive to manufacture generally requiring machined components. For example, the interdigital filter Model No. 3746 for MDS applications from Microwave Filter is commercially available at prices from $95 to $135. The Conifer Down Converter is also commercially available at about a price of $80. The combined price with a $10 jumper cable would be about $185 for the two separate units. Under the teachings of the present invention, the integration of the interdigital filter into the down converter would result in a price of about $100.

Even more dramatic cost savings result if multiple interdigital filters are used in parallel to filter the input signal of the down converter. This permits a number of separate microwave frequency bands received by an appropriate antenna to be filtered and converted to corresponding predetermined output frequency bands by means of a single down converter. One interdigital filter is used for each input frequency band. For example, by using two interdigital filters, both the MDS and ITFS bands can be converted by a single down converter.

SUMMARY OF THE INVENTION

A problem with using the existing separate down converter and separate interdigital filters relates to the provision of the separate waterproof housings for each of the interdigital filters, the requirement for separate jumper cables for interconnection, and the overall expense of providing interdigital filters composed of machined parts.

The present invention solves these problems by integrating a number of interdigital filters into the down converter thereby eliminating the need for a separate waterproof housing for each interdigital filter and the need for an interconnecting jumper cables. The present invention also provides a method for constructing each interdigital filter from sheet metal using a die stamp to cut out the various components of the interdigital filter. Four sides of the housing for each interdigital filter are constructed from the sheet metal whereas the fifth side of the housing comprises a ground plane deposited on a printed circuit board of the down converter and the last side is also a separately cut piece from sheet metal. Once the mill stock is stamped out, the resulting cut-pieces are formed into the proper housing configuration for each interdigital filter.

The elements of each of the interdigital filters are then inserted into the housings, aligned, and permanently affixed thereto. The filters are then tuned for proper operation.

A single input jack can be employed to deliver the microwave input signal to each of the interdigital filters in parallel. Each interdigital filter is designed to pass only a specified band of input frequencies. The coupling between the input jack and each of the interdigital filters provides a relatively low impedance path for the respective input signal band of each filter. By changing the geometry of the coupler and/or the type of coupling (i.e. inductive or capacitive coupling) to each filter, a relatively high input impedance path is provided for input signals outside of the band of each filter. The filtered output signals of each of the interdigital filters are then separately amplified and converted by the down converter to produce one output signal band for each input signal band.

The integrated down converter and interdigital filters of the present invention and the method for constructing the integrated combination results in a device that competes, in cost, with conventional integrated band pass filters (i.e., printed filters and dual cavity filters) of much lower performance.

DESCRIPTION OF THE DRAWING

FIG. 20 is a perspective view of the cut piece of FIG. 19 formed into the shape of one of the interdigital filters housings shown in FIG. 18;

FIG. 21 is a top planar view of the second cut piece of the alternative embodiment formed into a bracket;

FIG. 22 is a perspective view showing the cut piece of FIG. 21;

FIG. 24 is a partial perspective view showing the connection of the housings to the jack plate and bracket;

FIG. 25 is a partial perspective view showing the soldering of the housings to the printed circuit board of the down converter.

DETAILED DESCRIPTION

Figure 1:
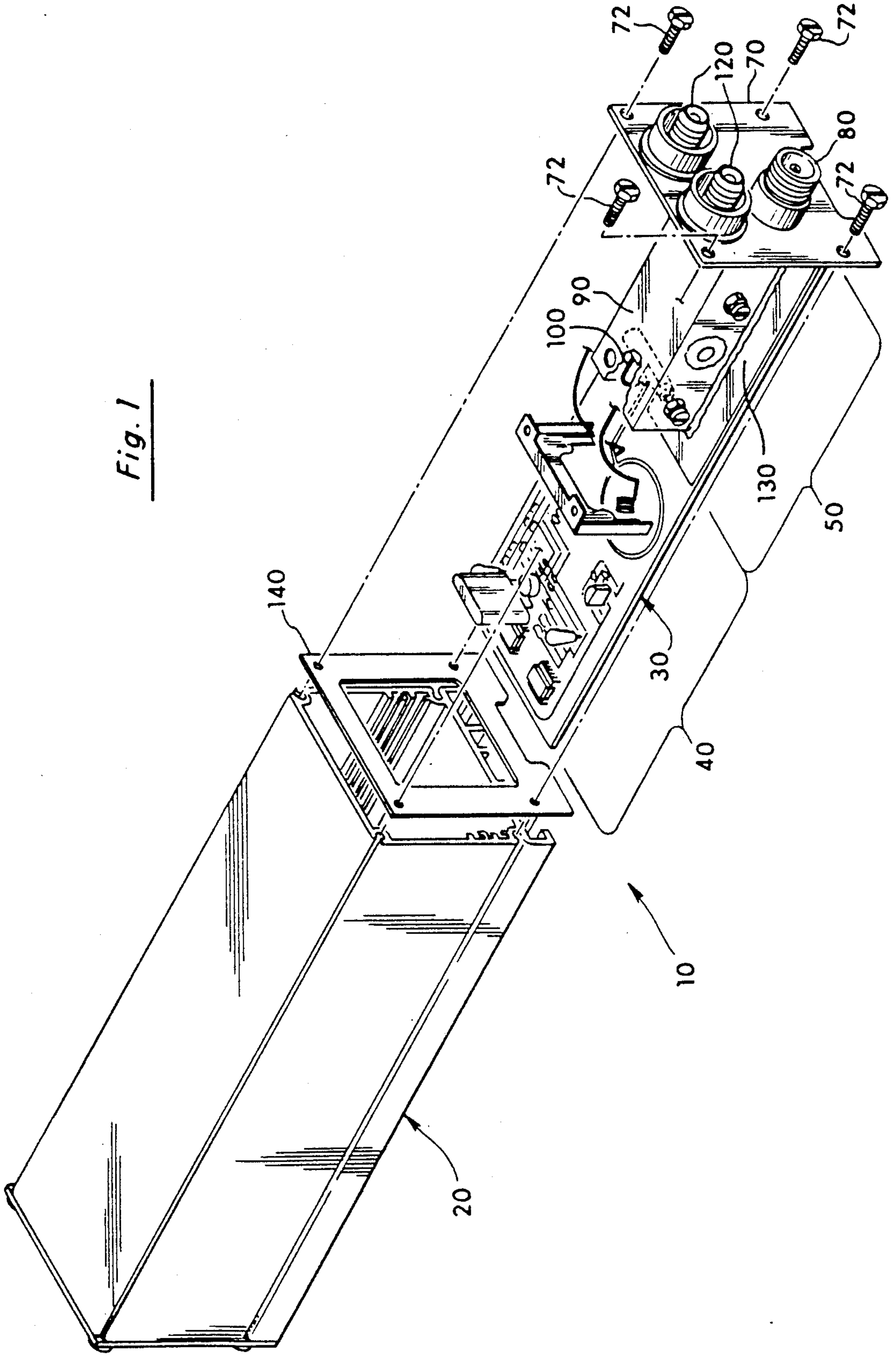
FIG. 1 is an exploded perspective view showing the major components of the integrated down converter and interdigital filter of the present invention.

In FIG. 1, the integrated down converter and interdigital filter of the present invention 10 is shown to include a waterproof housing 20, a single circuit board 30 containing a portion of the down converter section 40 and the interdigital filter section 50. A jack plate 70 is shown which interconnects to the waterproof housing 20 by means of screws 72. The microwave signal coming into the down converter from the antenna, not; shown, is received through the N-connector 80 for delivery into the interdigital filter housing 90 which is then filtered in a predetermined bandwidth such as 2500–2686 MHz by the interdigital filter and delivered to lead 100 for processing by the down converter section 40. The resulting electrical output signals from the down converter which corresponds to the filtered microwave signals are then delivered to the output connectors 120. A portion of the interdigital filter 90 is the ground plane 130.

Under the teachings of the present invention, the interdigital filter section 50 is incorporated onto the printed circuit board carrying the conventionally available down converter section 40 and is mounted into the waterproof housing 20. The jack plate 70 mounts over the jack plate gasket 140 which is preferably a closed-cell light density neoprene material. When screws 72 are connected, the combined down converter and interdigital filter is securely protected within the waterproof housing 20.

Figure 3:
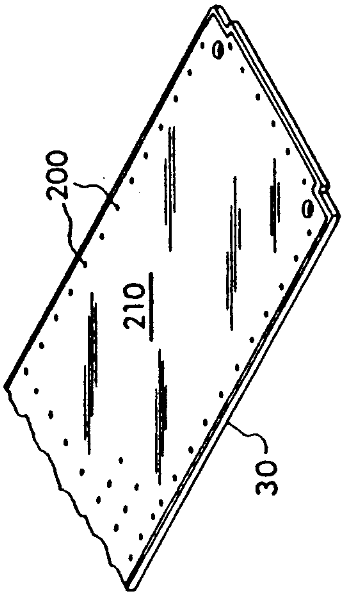
FIG. 3 is a partial perspective view, cut-away, of the opposite side of the printed circuit board of FIG. 2.
Figure 2:
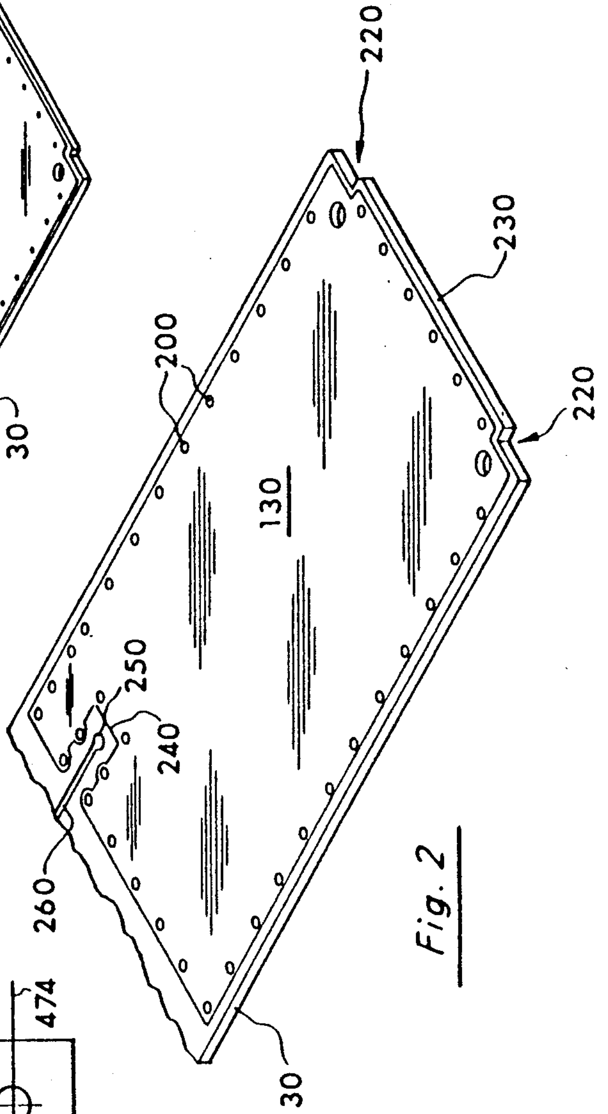
FIG. 2 is a partial perspective view of the portion of the down converter printed circuit board dedicated to receiving the interdigital filter of the present invention.

In FIG. 2, the down converter printed circuit board 30 is shown. This circuit board is preferably manufactured from 1/16th inch double-clad fiberglass epoxy board. The silver cladding on board 30 is etched away to define the rectangular ground pad 130. The ground plane conductive surface or pad 130 has a plurality of holes 200 formed around the outer periphery thereof which provides conductive paths to the opposite side of board 30, designated 210 in FIG. 3. The opposite side of board 30, as shown in FIG. 3, also has a ground pad 210 etched to remain in place directly under surface 130. The formed conductive holes 200 insure that ground potential is maintained throughout pad 130. The circuit board 30 has indents 220 formed on end 230 for mounting to the jack plate 70. Likewise, a formed U-shaped indent 240 is formed in the ground plane pad 130 in order to provide an area to place a conductive pad 250 and lead 260 to which wire 100 from the interdigital filter 90 is connected. Lead 260 delivers the signal from the interdigital filter into the down converter circuitry 40 in a conventional fashion.

Figure 4:
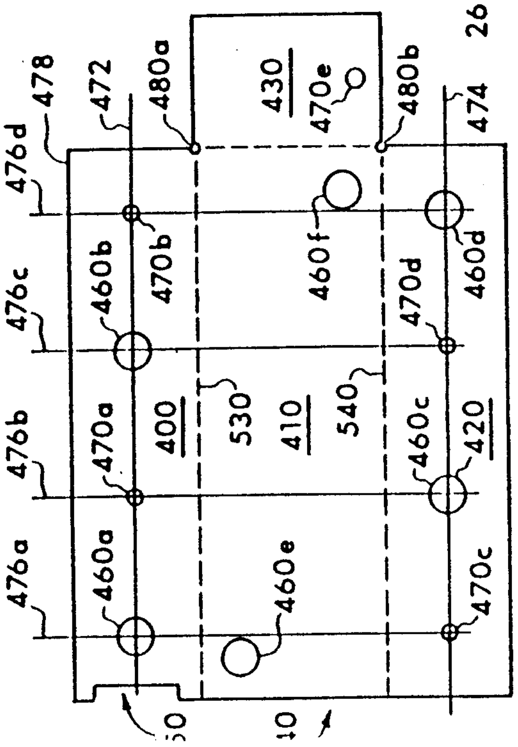
FIG. 4 is a top planar view of the first cut piece of the present invention comprising four sides of the interdigital filter housing.

In FIG. 4, four sides of the housing 90 for the interdigital filter are shown. These sides are designated 400, 410, 420, and 430. The piece 440 containing these sides is cut out of sheet metal through a blanking process. A die, not shown, is created to cut the sheet metal in the form shown in FIG. 4. Side 400 has an indent cutout 450 and whose function will be explained later. In addition, 400 has two cut out holes 460*a* and 460*b* which are each 0.218 inches in diameter. Likewise, side 400 has two formed holes 470*a* and 470*b* which are each cut to a 0.089 inch diameter. Holes 460*a*, 460*b*, 470*a* and 470*b* are equally spaced apart along line 472. Likewise, opposing side 420 has holes 460*c*, 460*d*, 470*d* and 470*d* equally spaced along line 474. The holes on side 400 directly oppose the holes on side 420 as indicated by lines 476*a* through 476*d*. Line 472 is 0.375 inches from surface 478 whereas line 474 is 2.267 inches from surface 478 in the preferred embodiment. On side 410 are located two holes 460*e* and 460*f* oriented in opposing corners on side 410. Finally, side 430 has a cut hole 470*e* centrally located on the edge near side 420. In addition, small cut-aways 480*a* and 480*b* are provided at the junction between side 430 and sides 400 and 420. Under the teachings of the present invention, the die, not shown, cuts out four sides of housing 90 as a single piece 440 as shown in FIG. 4. All holes 460 and 470 are cut and all excess material is removed. The material used is preferably 0.0159 inch one-half hard brass. Holes 470*a*, 470*b*, 470*c*, and 470*d* are then threaded.

Figure 5:
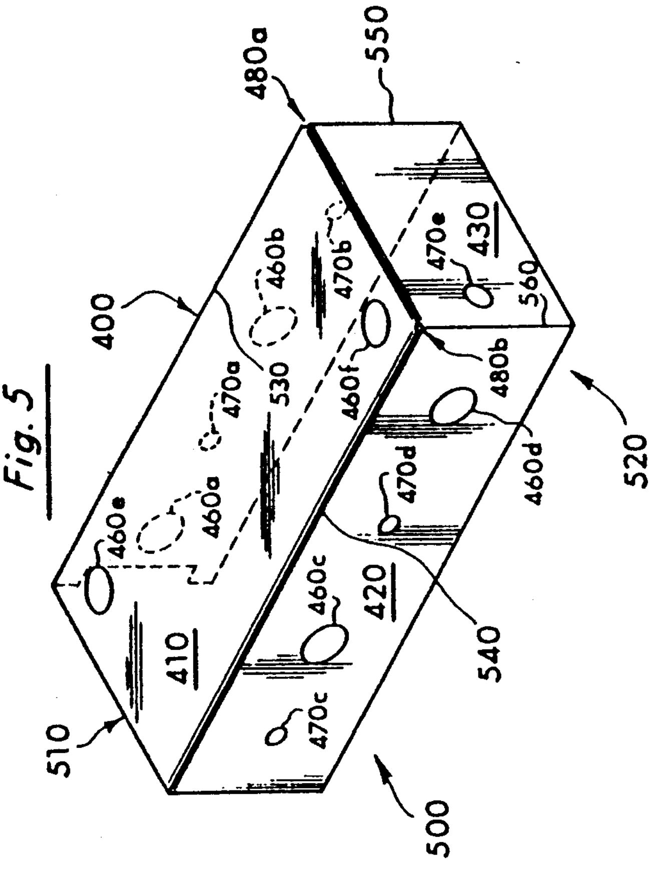
FIG. 5 is a perspective view of the cut piece of FIG. 4 formed into the shape of the housing of the present invention.

In FIG. 5, the piece 440 of FIG. 4 is formed into the housing 440 shown in FIG. 5. The housing 500 has an open end 510 and an open bottom 520. The housing 500 is formed by bending piece 440 as shown in FIG. 4 along lines 530 and 540 with a forming machine. A butt seam is also formed at corners 480*a* and 480*b*. In the forming process, ends 550 and 560 simply abut together.

Figure 6:
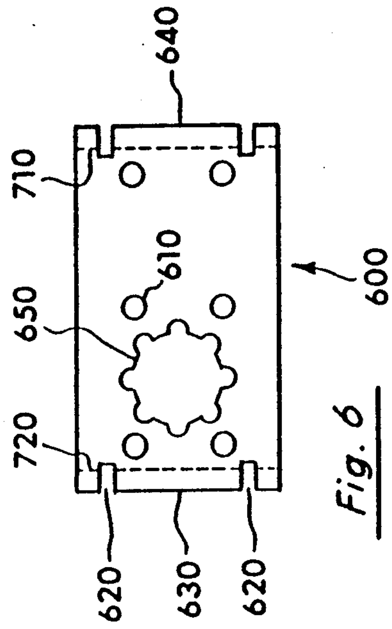
FIG. 6 is a top planar view of the second cut piece of the present invention.

In FIG. 6, the details of the jack plate bracket 600 are shown. The jack plate bracket 600 is also cut out from sheet metal stock into the shape and configuration shown in FIG. 6. In FIG. 6, the rectangular shaped piece formed is cut from 0.0159 inch one-half hard brass stock. Six holes 610 are cut therein. Each of these holes preferably is 0.125 inches in diameter and are designed to receive rivets as will be subsequently explained. Likewise, four indents 620 are cut in opposing sides 630 and 640 of 600.

Finally, the substantially circular hole 650 is cut from piece 600 to receive the N-connector 80 as shown in FIG. 1. Hole 650 is 0.500 inch hole with 0.063 inch notches cut out at 45 degree points around the edge.

Figure 7:
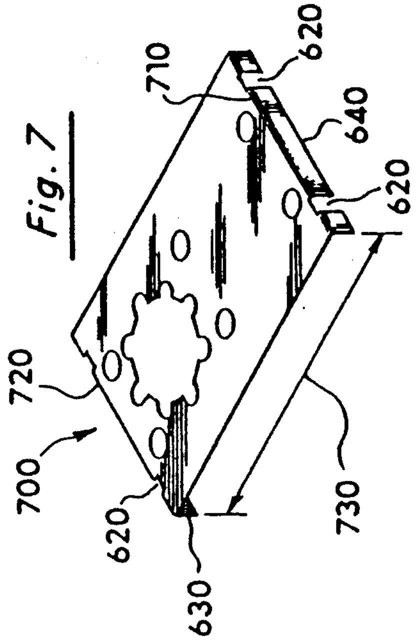
FIG. 7 is a perspective view showing the cut piece of FIG. 6 formed into its bracket shape.

As shown in FIG. 7, piece 600 is bent in the shape of formed piece 700 along lines 710 and 720. The distance 730 between edges 630 and 640 in the preferred embodiment is 1.750 inches.

Figure 9:
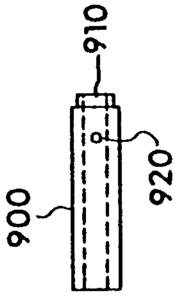
FIG. 9 is a side planar view of an end element of the present invention.
Figure 8:
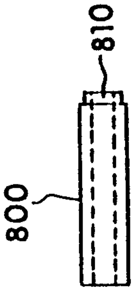
FIG. 8 is a side planar view of an interior element of the present invention.

In FIGS. 8 and 9 are shown the details of the elements of the interdigital filter 90 of the present invention. In FIG. 8, is shown the interior element 800 which is cut from copper tubing having a 0.250 inch outer diameter with a 0.031 inch wall thickness. In FIG. 8, element 800 is typically 1.00 inches long having an annular region 810 which is typically 0.062 inches deep. A conventional screw machine is used to form annular region 810. It can also be formed by turning on a lathe. Likewise, in FIG. 9, the end element 900 is preferably 1.1017 inches long also having an annular region 910 which is also set back 0.062 inches. A hole 920 is cross drilled through element 900.

Figure 10:
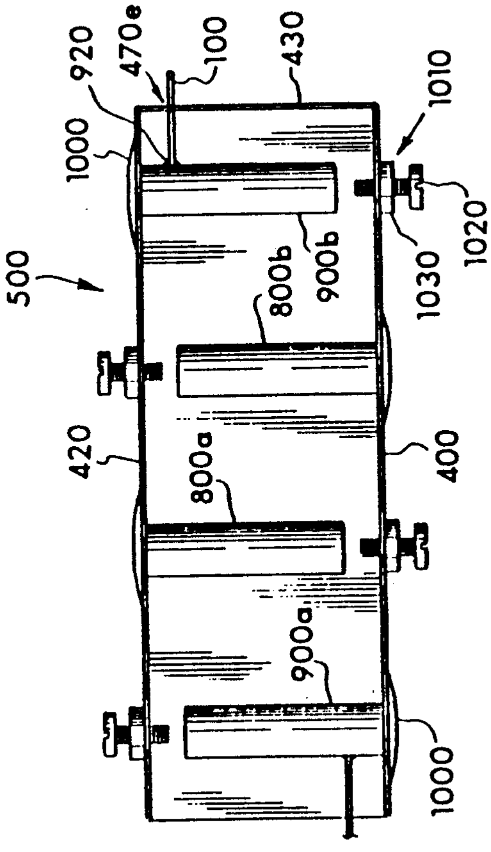
FIG. 10 is a bottom planar view of the housing of FIG. 4 with the elements of FIGS. 8 and 9 attached therein.

In FIG. 10, the bottom planar view of the formed housing 500 is shown with tuning elements 800*a*, 800*b*, 900*a*, and 900*b* mounted therein. The spatial location of these tuning elements is made according to the teachings of Hinshaw, et al. supra. In FIG. 10 each element is soldered to the side of the housing as indicated by 1000. Each element has associated with it and directly opposite from it a tuning screw assembly 1010 comprising a tuning screw 1020, and a nut 1030. Elements 800 and 900 are mounted through the formed holes 460 whereas the screws 1020 are mounted through the formed and threaded holes 470. Wire 100 is soldered to end element 900*b* through hole 470*e*. In the preferred embodiment nut 1030 located on the outside of the housing 500 is tightened after the elements are tuned to firmly hold the screws 1020 which are threaded into hole 470. The arrangement of the tuning elements and the tuning screws are conventional.

Figure 11:
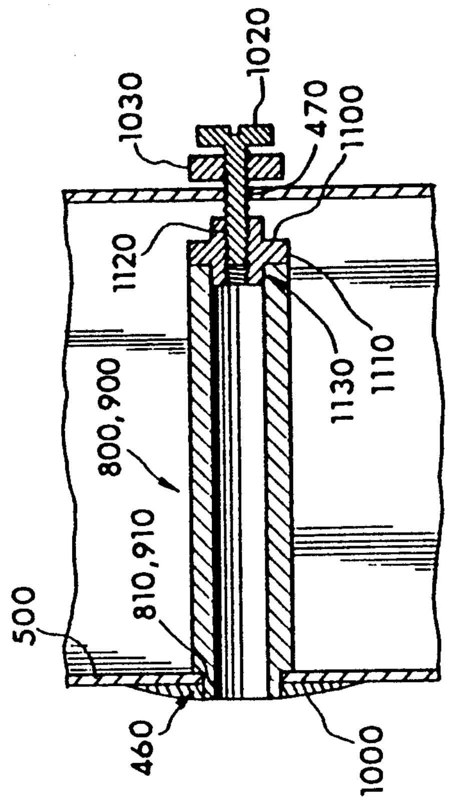
FIG. 11 illustrates the alignment of an element for attachment to the housing.

In FIG. 11, the element 800 or 900 is inserted into hole 460 of the formed housing 500. A. threaded collar 1100 is placed into the interior of the element 800, 900. Collar 1100 has a lip 1110 which abuts against end 1130. The collar 1100 in turn has threads 1120 to receive the threaded end of screw 1020. The screw is then tightened into the collar 1100 so that the screw 1020, and the collar 1100 firmly holds end 1130 of the element 800, 900. In this arrangement, the element is in perfect alignment and solder 1000 can now be applied. In other words, the steps in assembling the element 800, 900 to the formed housing 500 are as follows:

1. Place the annular end 810, 910 of an element 800, 900 into the cut hole 460 of the formed housing.
2. Insert the collar 1100 into the end 1130 of the element.
3. Insert the threaded end of screw 1020 into the opposite end of the collar 1100 to firmly hold the element 800, 900 in place.
4. Apply the solder 1000 over the annular end of the element.
5. Loosen the screw 1020.
6. Remove the collar 1100.

It is to be expressly understood that this is one preferred method of installing the elements into the formed housing. In another approach, the annular region 810, 910 of an element 800, 900 rather than being soldered can be riveted, by curling end 810, 910 over with an anvil tool in a conventional fashion, to housing 500.

Figure 12:
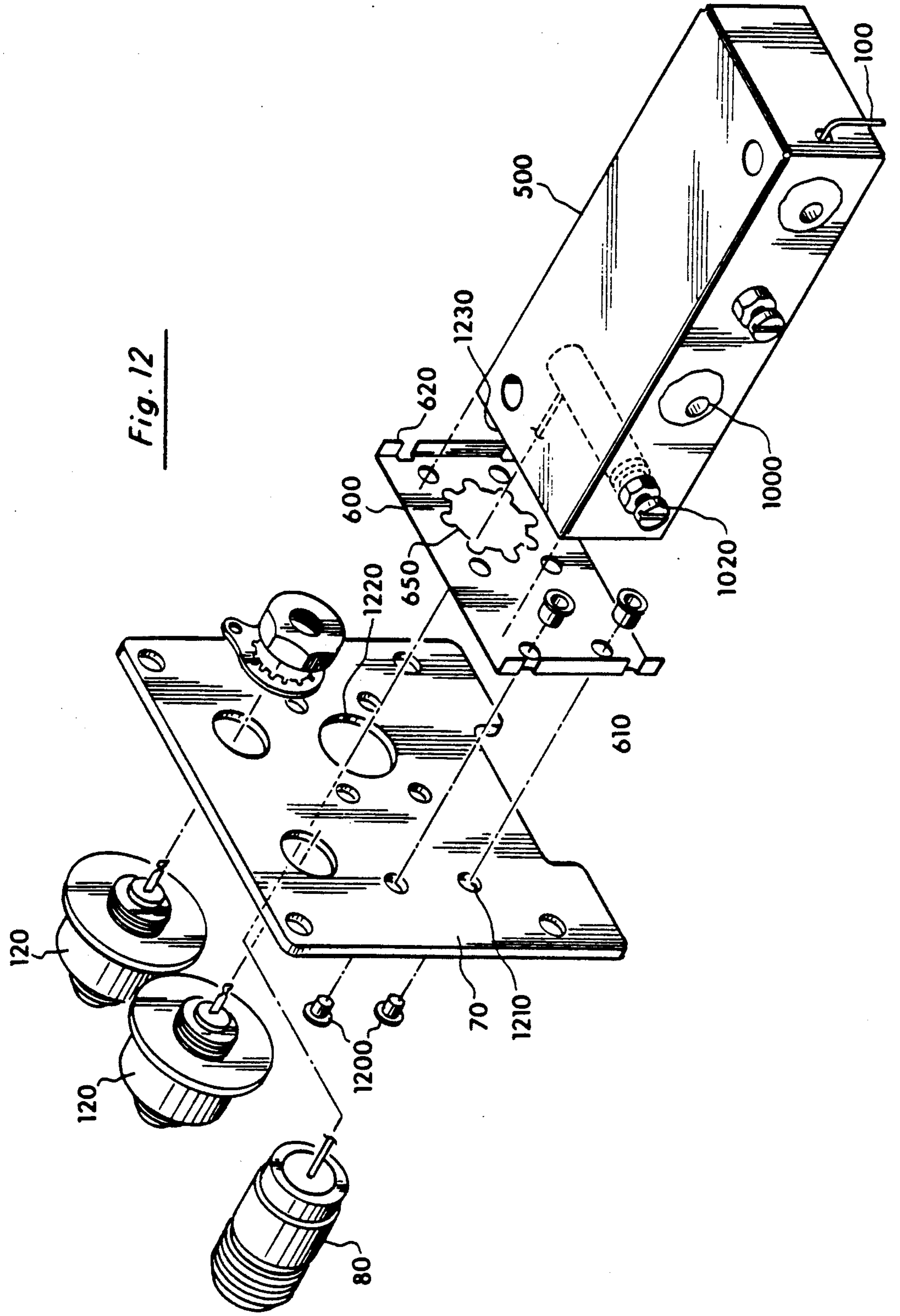
FIG. 12 is an exploded perspective view showing the assembly of the housing to the jack plate.
Figure 13:
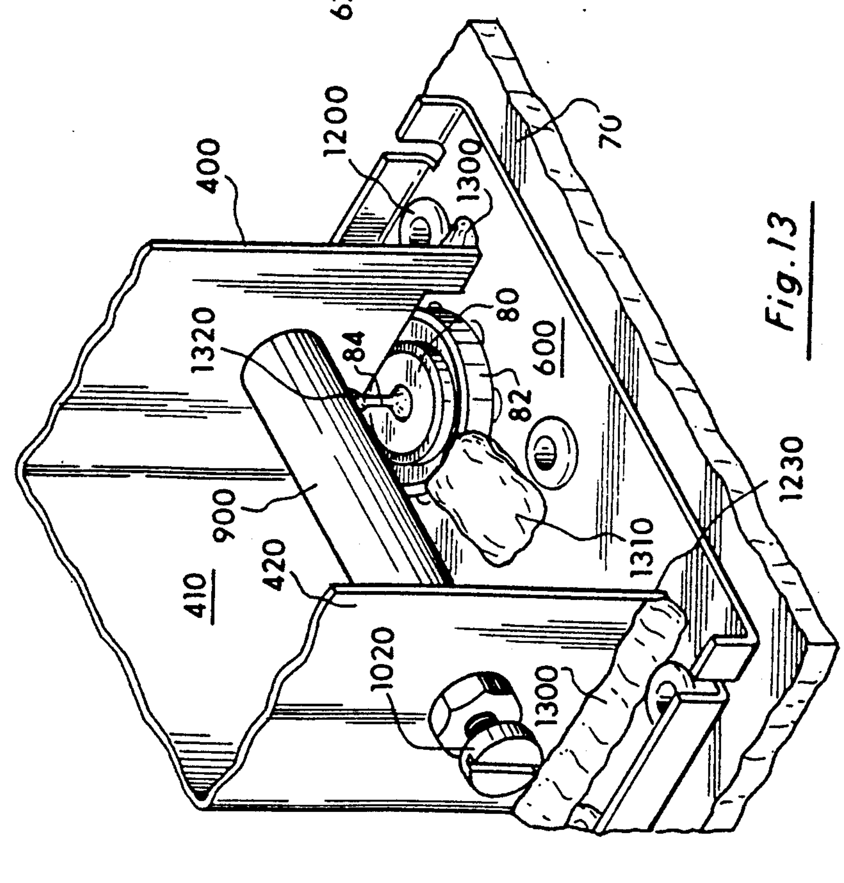
FIG. 13 is a partial perspective view showing the soldered connection of the housing to the jack plate bracket.

In FIG. 12, the housing 500 containing the assembled elements is mounted to the jack plate 70. This occurs in the following fashion. First, the jack plate bracket 600 is mounted to the jack plate 70 by means of rivets of 1200 of the jack plate through holes 1210 and through holes 610 of the jack plate bracket 600. The jack plate bracket is then firmly riveted by means of the six rivets 1200 to the jack plate 70. The N-connector 80 is then inserted through formed hole 1220 of the jack plate and through the cut hole 650 of the jack plate bracket. The open end 510 of the housing 500 is then mounted to the jack plate bracket 600 as shown in FIG. 13. The open end 510 is placed against the surface of the jack plate bracket 600 and the end 1230 is soldered at 1300 all along its periphery on sides 420, 410, and 400. This firmly holds the housing to the jack plate bracket 600 which is in turn riveted to the jack plate 70. The outer conductor 82, of the N-connecter 80 is also soldered at 1310 to the jack plate bracket 600. The center conductor 84 of the N-connecter 80 is then soldered at 1320, to the terminal element 900 (i.e., the element nearest the jack plate) at hole 920. In this fashion, the interdigital filter of the present invention is firmly attached to the jack plate 70. The remaining connecters 120 (see FIG. 12) can then be added to the jack plate 70 in a conventional fashion.

Figure 14:
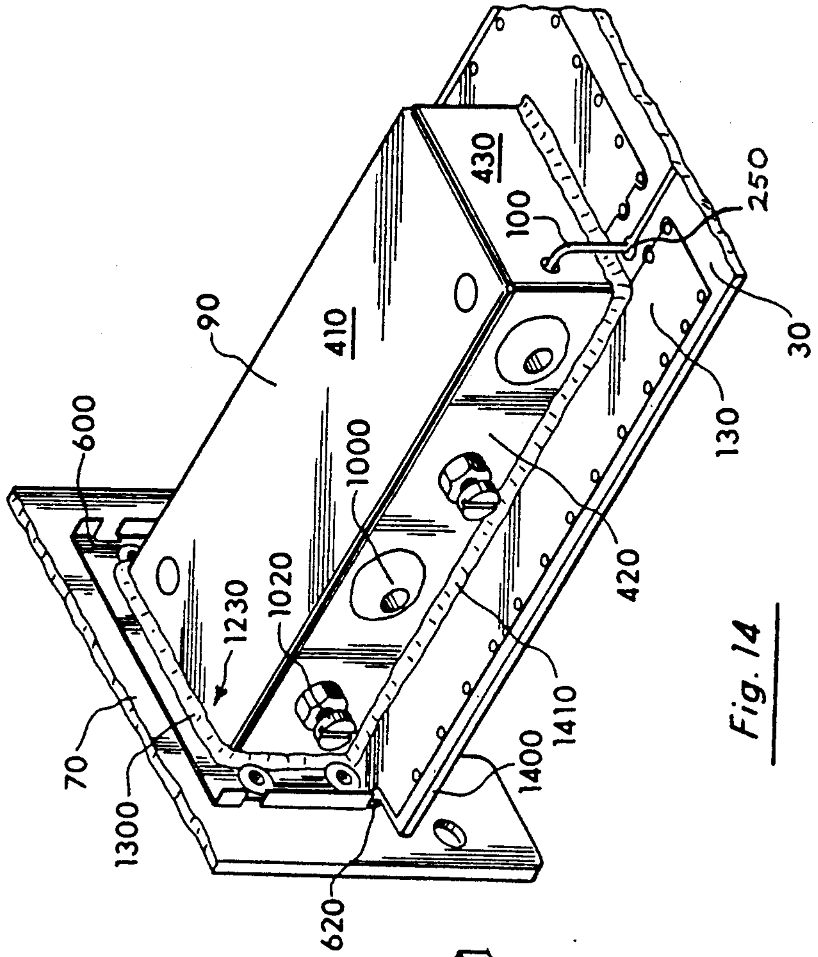
FIG. 14 is a partial perspective view showing the soldering of the housing to the printed circuit board of the down converter.

The final assembly of the housing to the down converter is shown in FIG. 14 whereby the jack plate carrying the jack plate bracket 600 with the housing 90 extending therefrom is placed over the circuit board 30 to rest the open bottom on the ground plane conductive surface 130 as shown in FIG. 14. The end 1400 of the circuit board 30 engages the formed slots 620 of the bracket 600. The open end of the housing 90 is then soldered at 1410 all the way around the outer periphery of the housing 90 to affix the housing to the surface in order to fully enclose the interior of said housing in a conductive envelope whose potential is at ground as shown in FIG. 14. Lead 100 is soldered to the pad 250 to electrically interconnect with the conventional down converter circuit 40. As shown in FIG. 10, the farthest element from the jack plate is interconnected with lead 100 and lead 100 carries the filtered microwave signal in the desired bandwidth.

The interdigital filter 90 can now be tuned by adjustment of the screws 1020 to obtain the desired performance. This tuning occurs in a conventional fashion.

Figure 15:
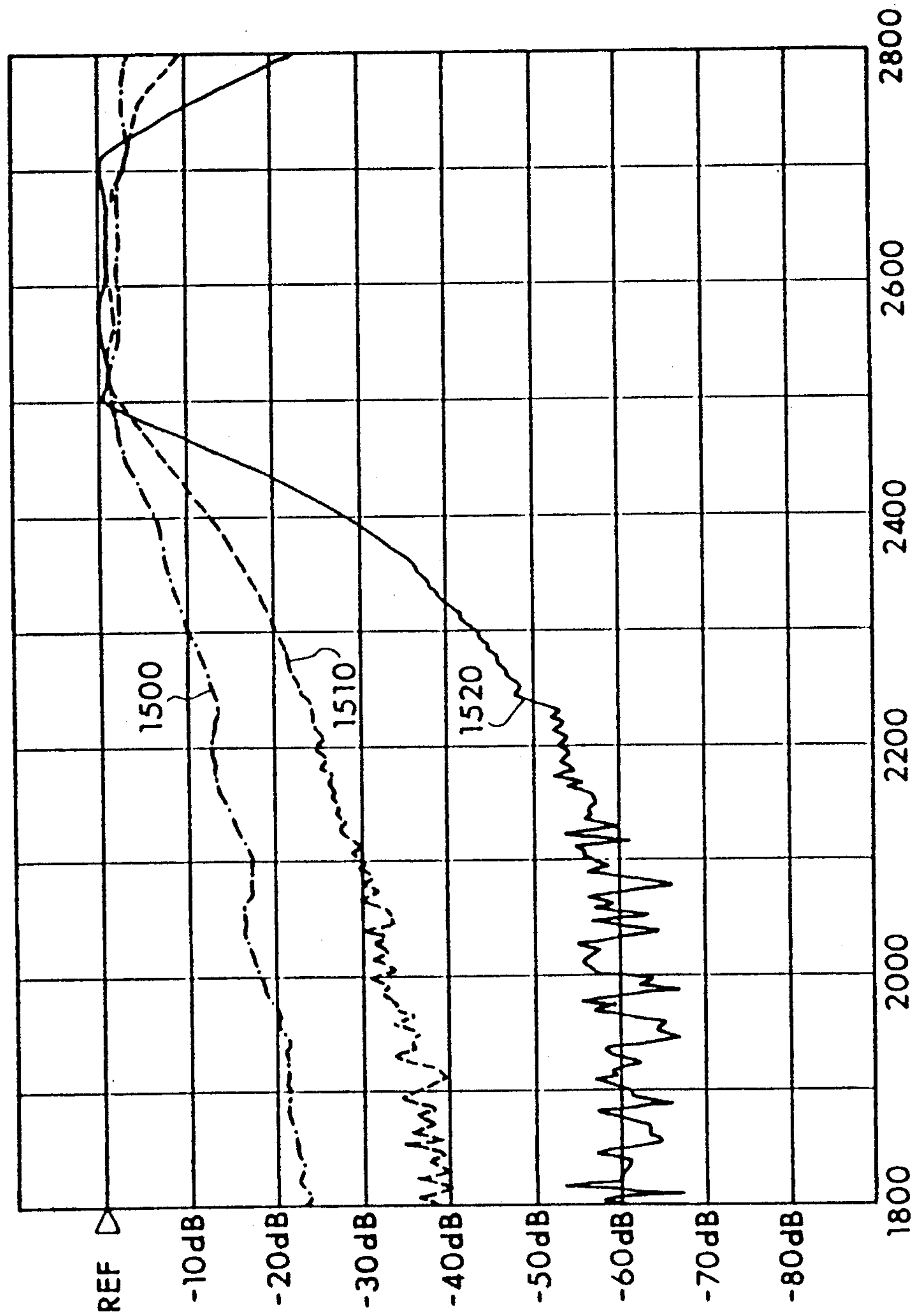
FIG. 15 graphically illustrates the bandwidth performance of the integrated interdigital filter of the present invention.
Figure 16:
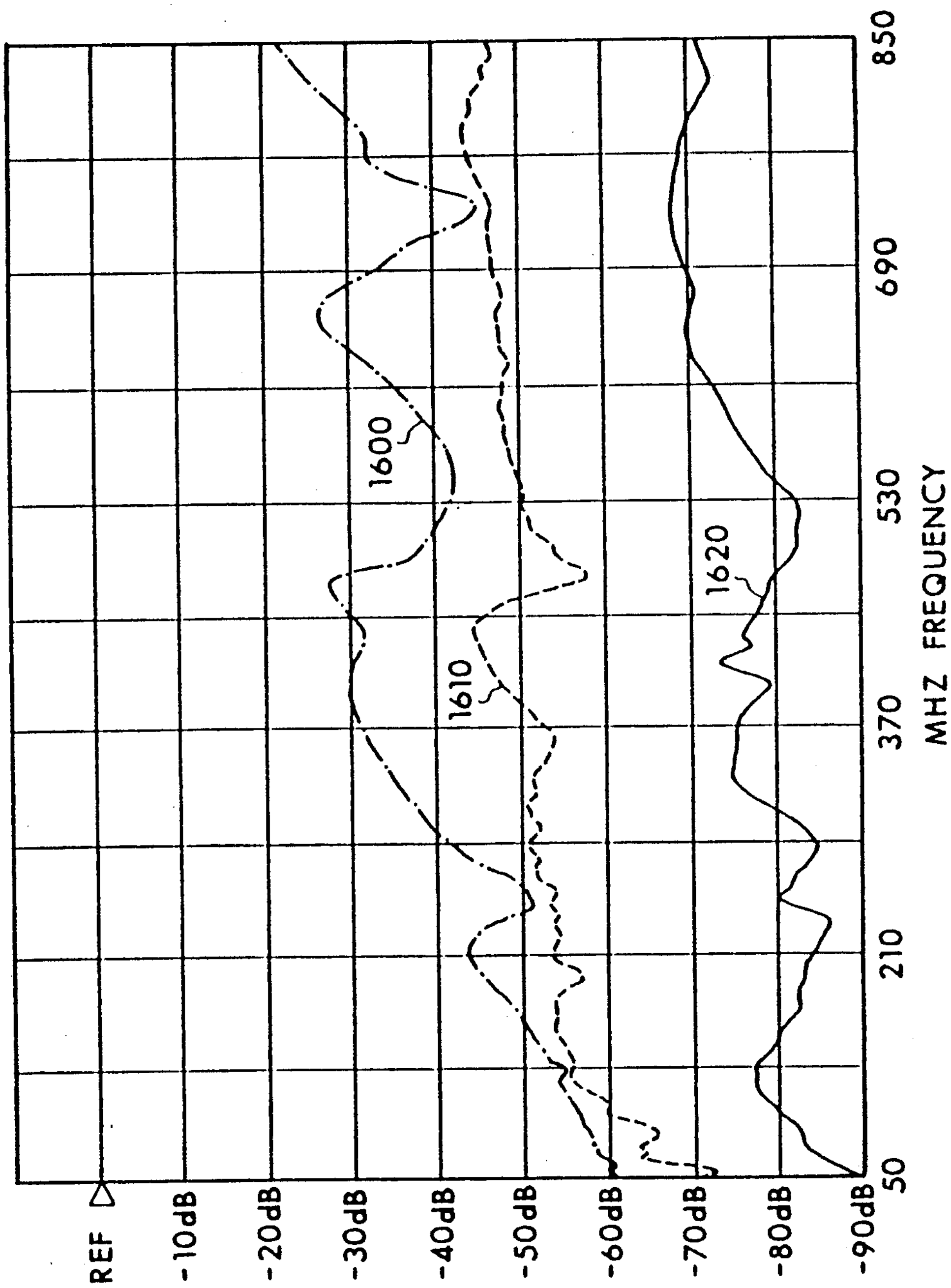
FIG. 16 graphically illustrates the IF rejection of the integrated interdigital filter of the present invention.

In FIGS. 15 and 16 are shown the performance of the integrated filter of the present invention designed for the ITFS of frequencies of 2500 to 2686 MHz in comparison to printed filters or integrated dual cavity filters for the same range of frequencies.

In FIG. 15 band pass for the interdigital filter described above is shown. Note that the band pass is from 250 MHz to 2686 MHz. Curve 1500 is for a printed filter, curve 1510 is for a dual cavity filter, and curve 1520 is for the filter of the present invention. This curve shows the sharp band pass for the filter of the present invention. The reference line REF is more closely obtained by the interdigital filter thereby showing a lower insertion loss of this filter when compared to the other two filters. The one to three dB lower insertion loss improves the noise figure by a like amount. In addition, the interdigital filter quickly drops from the reference point to a minus 60 db level. When compared to the printed and dual cavity filters, the image frequencies are down 25-40 dB. Hence, the image frequencies of 2056 MHz and 1870 MHz are much better suppressed with the interdigital filter of the present invention.

In FIG. 16, the IF rejection of the present invention is compared to the dual cavity and printed filters. The curve for the printed filters shown is 1600, the curve for the dual cavity is shown as 1610, and the curve for the interdigital filter of the present invention is shown as 1620. It is to be noted that the interdigital filter 1620 curve is approximately 20 to 30 db below that of the dual cavity filter. I.F. rejection is improved for three reasons: (1) the extremely high selectivity characteristics of the interdigital filter of the present invention; (2) the fully enclosed filter allows little leakage of VHF frequencies; and (3) the center conductor 84 of the N-connector 80 is virtually shorted to ground at VHF frequencies due to its tap point 1320 on element 900*a*.

Figure 17:
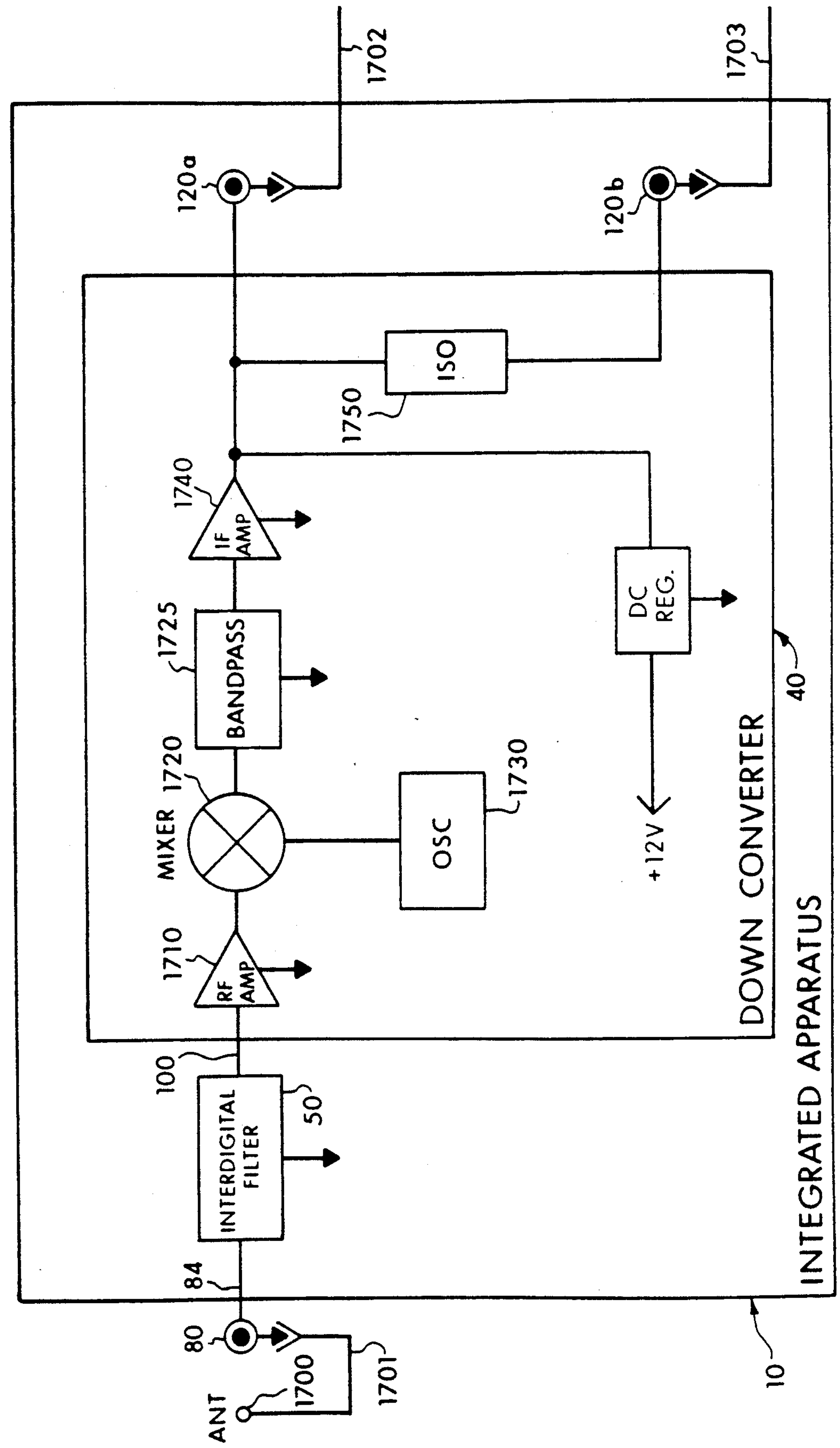
FIG. 17 is a block diagram schematic of the integrated down converter interdigital filter of the present invention.

In FIG. 17, the block diagram schematic of the integrated down converter interdigital filter 10 of the present invention is shown interconnected with a microwave antenna 1700 over cable 1701 to the N-connector 80. The electrical signal output of the present invention 10 is delivered from connector 120*a* and 120*b* over cables 1702 and 1703. The interdigital filter 50 receives the microwave signal from the N-connector 80 over lead 84 and filters the signal for delivery to lead 100 in the desired bandwidth. Lead 100 inputs the signal to a conventional down converter 40 which processes the signal as follows. The signal on lead 100 is delivered into an RF low noise amplifier 1710 which delivers the amplified signal to mixer 1720 which is driven by local oscillator 1730 (e.g., 2278 MHz). The output of mixer 1720 is filtered by a band pass filter 1725 (e.g., 222 MHz to 408 MHz) for delivery to an I.F. amplifier 1740. The I.F. amplifier delivers the electrical output signal to connector 120*a* and to an isolation network 1750 for delivery to connector 120*b*. The cable that carries the output signal from the I.F. amplifier also is used to carry power from the DC regulator to other sections of the down converter circuitry.

Finally, the cost of constructing the high performance integrated interdigital filter of the present invention is significantly less than that of a separate interdigital filter in its own waterproof housing. The cost of the interdigital filter of the present invention is about $20. The reason for this low cost is due entirely to the integration of the filter onto the down converter board (thereby eliminating the costly jumper cable, waterproof housing, and associated mounting hardware). The unique manner of construction for the filter also lowers costs, being stamped and formed sheet metal brass to create the filter housing 500 and to use the printed circuit board itself as one side of the filter housing.

While the preceding discussion and FIGS. 1 through 17 has been directed to an embodiment of the present invention for the ITFS band, it is expressly understood that an integrated down converter interdigital filter for the MDS band or any other microwave band could also be constructed under the teachings of the present invention.

An alternative embodiment of the present invention having multiple interdigital filters is shown in FIGS. 18 through 26. This embodiment permits a number of separate microwave signal bands received by an appropriate antenna to be filtered and converted to corresponding predetermined output bands by means of a single down converter unit. The embodiment shown in FIGS. 18 through 26 incorporates two interdigital filters in parallel on the same printed circuit board with the down converter. One of these interdigital filters is tuned to the ITFS band (2500 to 2686 MHz), while the other is tuned to the MDS band (2150 to 2162 MHz). However, other microwave bands could be used as well. Furthermore, additional interdigital filters could be employed in parallel to provide more than two bands.

Figure 18:
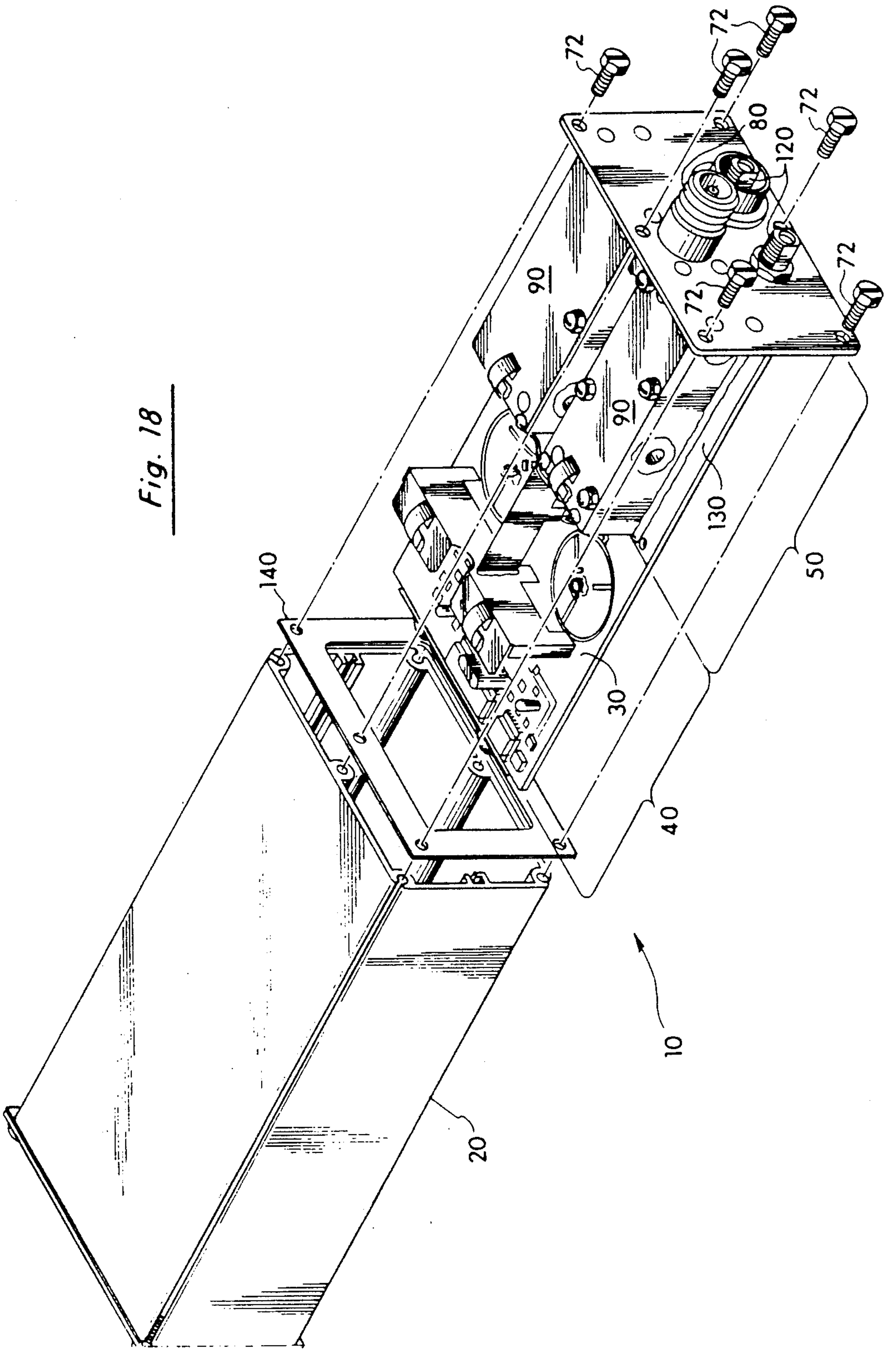
FIG. 18 is an exploded perspective view showing the major components of an alternative embodiment of the present invention having an integrated down converter and two interdigital filters.

FIG. 18 corresponds generally to FIG. 1 of the previous embodiment. However, two separate interdigital filter housings 90 are mounted in parallel on the same printed circuit board with the down converter 30.

Figure 19:
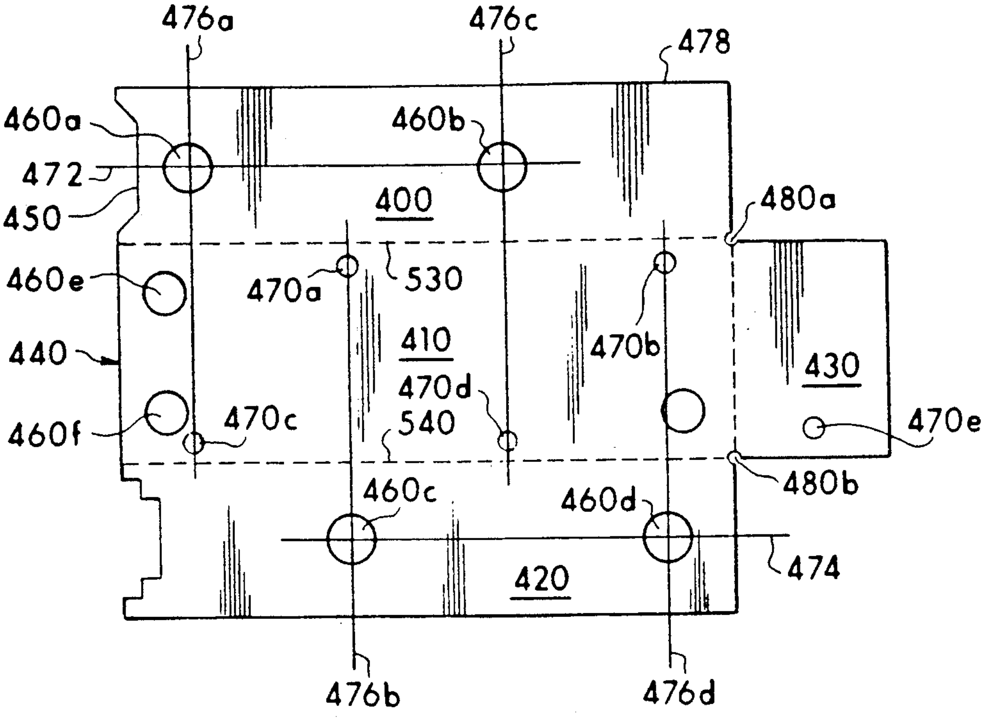
FIG. 19 is a top planar view of the first cut piece used to form four sides of an interdigital filter housing in the alternative embodiment in FIG. 18, showing the holes for the tuning screws in alternative locations.

FIG. 19 corresponds generally to FIG. 4 of the first embodiment, and shows the sheet metal piece 440 use to form four sides of the housing 90 for each of the interdigital filters. In this alternative embodiment, the location of the tuning screw holes 470*a*, 470*b*, 470*c*, and 470*d* have been moved to the top surface 410 of the interdigital filter housing.

In FIG. 20, the housing 90 is formed by bending the piece 440 of FIG. 19 along lines 530 and 540. A butt seam is also formed at corners 480*a* and 480*b*.

FIGS. 21 and 22 show two views of the jack plate bracket 600 employed in the alternative embodiment. This bracket is formed from sheet metal stock as previously discussed in association with FIGS. 6 and 7.

Figure 23:
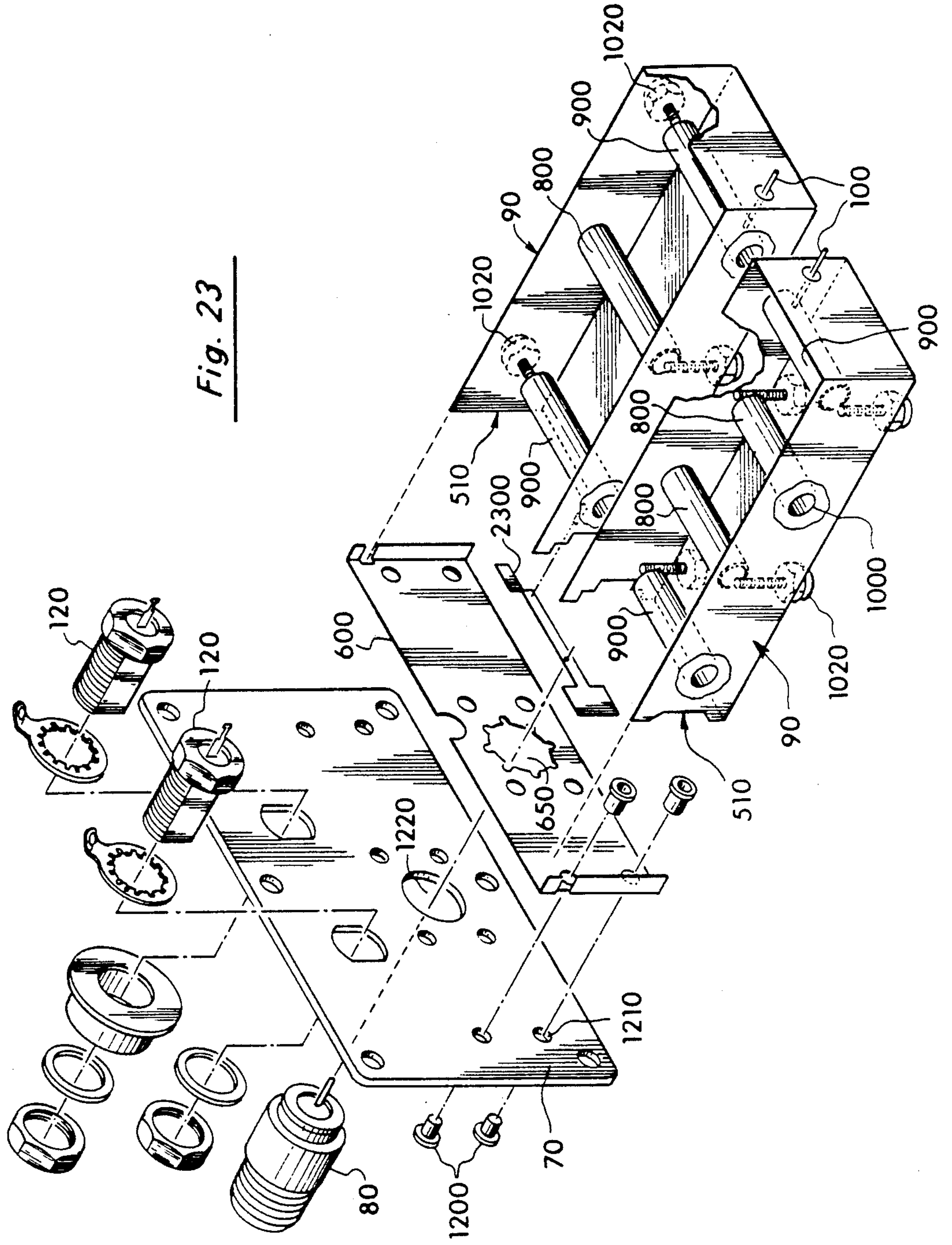
FIG. 23 is an exploded perspective view of the alternative embodiment of FIG. 18, showing the assembly of the housings to the bracket and jack plate.

In FIG. 23, the interdigital filter housings 90 are mounted to the jack plate 70. The jack plate bracket 600 is first mounted to the jack plate 70 by means of rivets 1200. The N-connector 80 is then inserted through the formed hole 1220 of the jack plate and through the cut hole 650 of the jack plate bracket. The open end 510 of each housing 90 is placed against the surface of the jack plate bracket 600 and soldered all along the edges of the housing sides. This firmly holds the interdigital filter housings 90 to the jack plate bracket 600 which is in turn riveted to the jack plate 70.

A connector 2300 provides electrical connection in parallel for the input microwave signal between the N-connector 80 and the first element of each filter. Either inductive or capacitive coupling of the input microwave signal to the first element of each filter can be employed. In addition, the shape and dimensions of the respective parallel branches of the connector can be designed to provide an input impedance that complements the bandpass characteristics of each filter. In other words, each branch of the connector should provide a low impedance path for microwave signals in the band passed by its respective interdigital filter, but provide a relatively high impedance path for microwave signals in the bands passed by the other interdigital filters. For example, FIGS. 18 through 26 show a downconverter with two interdigital filters for the ITFS and MDS bands. As shown most clearly in FIGS. 23 and 24, the connector 2300 extends from the N-connector 80 to the first elements in both interdigital filters 90. The left interdigital filter passes the higher ITFS band, while the right filter passes the lower MDS band. The branch of the connector 2300 extending to the left filter uses capacitive coupling, which has a lower impedance at high frequencies. The branch of the connector extending to the right filter uses inductive coupling, which has a lower impedance at low frequencies. Thus, the input impedances of the branches of the connector compliment the bandpass characteristics of the respective interdigital filters, and thereby improve the performance of the entire system.

The final assembly of the interdigital filter housings to the down converter is shown in FIG. 25 whereby the jack plate carrying the jack plate bracket 600 with the housings 90 extending therefrom is placed over the circuit board 30 to rest the open bottoms of the housings on the ground plane conductive surface of the circuit board. The open bottoms of the housings 90 is then soldered at 1410 all the way around the outer periphery of the housings 90 to affix the housings to the conductive surface in order to fully enclose the interior of said housings in a conductive envelope whose potential is at ground. Leads 100 are electrically interconnected with the conventional down converter circuit 40. As shown in FIG. 23, the farthest element from the jack plate in each filter is interconnected with a lead 100, which carries the filtered microwave signal in the desired bandwidth. The interdigital filter 90 can now be tuned by adjustment of the screws 1020 to obtain the desired performance. This tuning occurs in a conventional fashion.

Figure 26:
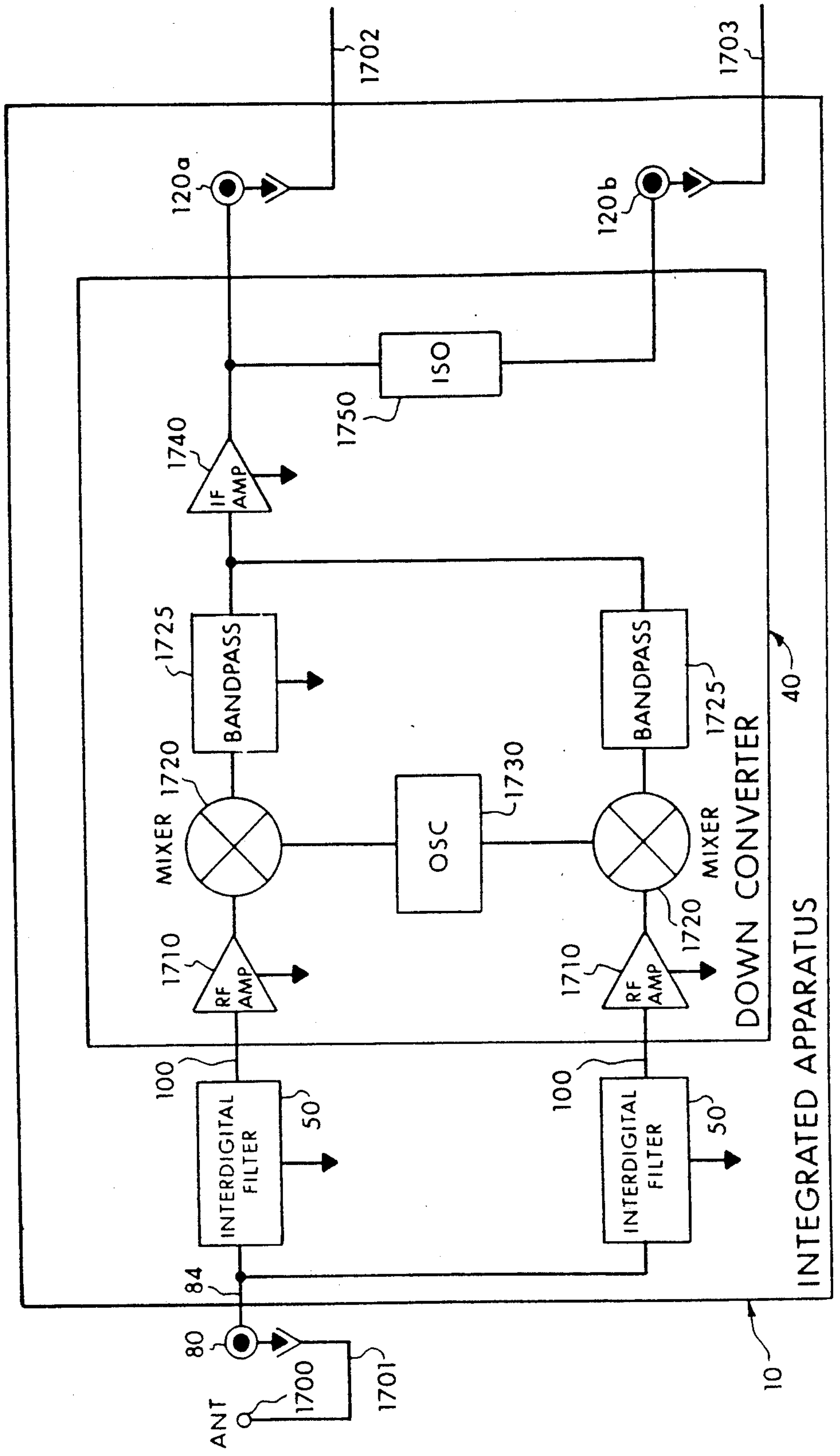
FIG. 26 is a block diagram schematic of the alternative embodiment of FIG. 18 through 25, wherein the integrated down converter includes two interdigital filters.

FIG. 26 is analogous to FIG. 17 of the first embodiment. In FIG. 26, the block diagram schematic of an down converter 40 with two interdigital filters 50 is shown interconnected with a microwave antenna 1700 over cable 1701 to the N-connector 80. The electrical signal output of the present invention 10 is delivered from connector **120*a* and 120*b* over cables 1702 and 1703. The interdigital filters 50 receives the microwave signal in parallel from the N-connector 80 and filter the signal for delivery to leads 100 in the desired bands. The down converter 40 processes the filtered signals as follows. The signal on each lead 100 is delivered into a respective RF low noise amplifier 1710 which delivers the amplified signal to a respective mixer 1720 which is driven by a common, local oscillator 1730 (e.g., 2278 MHz). The output of each respective mixer 1720 is filtered by a respective band pass filter 1725 (e.g., 222 MHz to 408 MHz for the ITFS band, and 116 Mhz to 128 MHz for the MDS band) for delivery to an I.F. amplifier 1740. The I.F. amplifier delivers the electrical output signal to connector 120*a* and to an isolation network 1750 for delivery to connector 120*b***. The cable that carries the output signal from the I.F. amplifier also is used to carry power from the DC regulator to other sections of the down converter circuitry.

The above disclosure sets forth a number of embodiments of the present invention. Other arrangements or embodiments, not precisely set forth, could be practiced under the teachings of the present invention and as set forth in the following claims.

I claim:

1. An integrated down converter interdigital filter apparatus receptive of a microwave signal for producing an electrical output signal in a predetermined band corresponding to said microwave signal comprising:

a planar surface, a down converter located on said planar surface having an electrical signal input and an electrical signal output, an interdigital filter also located on said planar surface, said interdigital filter comprising:

(a) a ground plane conductive surface formed on said planar surface, (b) a conductive rectangular housing having an interior and an open bottom, said housing having said open bottom affixed to said conductive surface in order to fully enclose the interior of said housing, (c) a plurality of conductive elements spatially located in said housing for filtering said microwave signal in said predetermined band, (d) means connected through said housing for interconnecting said microwave signal with one of said elements, means connected through said housing and connected to another one of said elements for interconnecting the filtered signal in said band from said interdigital filter to the input of said down converter, and means connected to the output of said down converter for delivering said electrical signal output from said down converter.

2. The integrated down converter interdigital filter apparatus of claim 1, wherein the planar surface is a printed circuit board.

3. An integrated down converter interdigital filter apparatus receptive of a microwave signal for producing an electrical output signal in a predetermined band corresponding to said microwave signal input comprising:

an apparatus housing having one end open, a jack plate for engaging said open end of said housing to provide a seal for said housing, a printed circuit board within said apparatus housing having a first end and a second end, a down converter located on said first end of said board, an interdigital filter located on the second end of said board, said interdigital filter comprising:

(a) a ground plane conductive surface formed on said second end of said printed circuit board, (b) a conductive rectangular filter housing having an interior, an end, anD an open bottom, said housing having said open bottom soldered to said conductive surface in order to fully enclose the interior of said housing in a conductive envelope, said end of said filter housing being connected to said jack plate, (c) a plurality of conductive elements spatially located in said filter housing for filtering said microwave signal in said predetermined band, with one of said elements being nearest to said jack plate and another of said elements being farthest from said jack plate, and (d) means connected to said jack plate and to said end of said filter housing for interconnecting said microwave signal with the element nearest said jack plate, means connected through said filter housing and connected to the element farthest from said jack plate for interconnected said filtered signal to the input of said down converter, and means connected to the output of said down converter and to said jack plate for delivering said electrical signal output from said apparatus housing.

4. An integrated down converter apparatus having a number of interdigital filters receptive of a corresponding number of microwave signal bands for producing an electrical output signal in a number of predetermined bands, each filter corresponding to one of said microwave signal bands, comprising:

a printed circuit board, a down converter located on said board having a electrical signal input and an electrical signal output, a number of interdigital filters also located on said board, each of said interdigital filters comprising:

(a) a ground plane conductive surface formed on said board, (b) a conductive rectangular housing having an interior and an open bottom, said housing having said open bottom affixed to said conductive surface in order to fully enclose the interior of said housing, (c) a plurality of conductive elements spatially located in said housing for filtering said microwave signal in one of said predetermined bands, (d) means connected through said housing for interconnecting said corresponding microwave signal band with one of said elements, and (e) means connected through said housing and connected to another of said elements for interconnecting the filtered signal in said corresponding band from said interdigital filter to the input of said down converter, and means connected to the output of said down converter for delivering said electrical signal output said down converter.

5. The integrated down converter apparatus of claim 4 further comprising:

(a) a housing enclosing the integrated down converter apparatus having one end open, and (b) means for engaging said open end of said housing to provide a watertight seal.

6. An integrated down converter apparatus having a number of interdigital filters receptive of a corresponding number of microwave signal bands for producing an electrical output signal in a number of predetermined bands, each filter corresponding to one of said microwave signal bands, comprising:

an apparatus housing comprising:

(a) an apparatus housing having one end open, (b) means for sealing said opening, and (c) means for engaging said sealing means and said open end of said housing to provide a seal, a printed circuit board within said apparatus housing, a down converter located on said board having an electrical signal input and electrical signal output, a number of interdigital filters also located on said board, each of said interdigital filters comprising:

(a) a ground plane conductive surface formed on said board, (b) a conductive rectangular filter housing having an interior and an open bottom, said filter housing having said open bottom affixed to said conductive surface in order to fully enclose the interior of said filter housing, (c) one end of said filter housing being connected to said engaging means, (d) a plurality of conductive elements spatially located in said filter housing for filtering said microwave signal in one of said predetermined bands, with one of said elements being nearest to said engaging means and another of said elements being farthest from said engaging means, (e) means connected to said engaging means and to said connected end of said filter housing for interconnecting said microwave signal with the element nearest said engaging means, and (f) means connected through said filter housing and connected to the element farthest from said engaging means for interconnecting said filtered signal to the input of said down converter, and means connected to the output of said down converter for delivering said electrical signal output from said down convertor.

7. An integrated down converter apparatus having a member of interdigital filters receptive of a corresponding number of microwave signal bands for producing an electrical output signal in a number of predetermined bands, each filter corresponding to one of said microwave signal bands, comprising:

an apparatus housing comprising:

(a) a housing having one end open, (b) a gasket for sealing around said opening, and (c) a jack plate for engaging said gasket and said open end of said housing to provide a seal for said apparatus housing, a printed circuit board within said apparatus housing having a first end and a second end, a down converter located on said first end of said board having an electrical signal input and an electrical signal output, a plurality of interdigital filters located on the second end of said board, each of said interdigital filters comprising:

(a) a ground plane conductive surface formed on said second end of said printed circuit board, (b) a conductive rectangular filter housing having an interior, an end, and an open bottom, said filter housing having said open bottom soldered to said conductive surface in order to fully enclose the interior of said filter housing in a conductive envelope, said end of said filter housing being connected to said jack plate, (c) a plurality of conductive elements spatially located in said filter housing for filtering said microwave signal in one of said predetermined bands, with one of said elements being nearest to said jack plate and another of said elements being farthest from said jack plate, (d) means connected to said jack plate and to said end of said filter housing for interconnecting said microwave signal with the element nearest said jack plate, and (e) means connected through said filter housing and connected to the element farthest from said jack plate for interconnecting said filtered signal to the input of said down converter, and means connected to the output of said down converter and to said jack plate for delivering said electrical signal output from said apparatus housing.

8. An integrated down converter apparatus having two interdigital filters receptive of two microwave signal bands for producing an electrical output signal in two predetermined bands, each filter corresponding to one of said microwave signal bands, comprising:

a printed circuit board, a down converter located on said board having an electrical signal input and an electrical signal output, two interdigital filters also located on said board, both of said interdigital filters comprising:

(a) a ground plane conductive surface formed on said board, (b) a conductive rectangular housing having an interior and an open bottom, said housing having said open bottom affixed to said conductive surface in order to fully enclose the interior of said housing, (c) a plurality of conductive elements spatially located in said housing for filtering said microwave signal in a corresponding one of said predetermined bands;

input signal connector means having two branches in parallel, connecting said microwave signal with one of said elements in both housings, each of said branches having a low impedance in the microwave signal band passed by the respective interdigital filter to which the branch is connected, but having a higher impedance in the microwave signal band passed by the other interdigital filter;

means connected through said housings and connected to another of said elements in both interdigital filters for interconnecting the filtered signals in both bands from said interdigital filters to the input of said down converter, and means connected to the output of said down converter for delivering said electrical signal output said down converter.

* * * * *